Aug. 30, 1966 A. H. WHITE 3,269,875

THERMOELECTRIC ASSEMBLY WITH HEAT SINK

Filed June 2, 1961 2 Sheets-Sheet 1

INVENTOR.
Arlton H. White

By F. A. Copeland Jr.
AGENT

THERMOELECTRIC ASSEMBLY WITH HEAT SINK

Filed June 2, 1961 2 Sheets-Sheet 2

INVENTOR.
Arlton H. White
By J. D. Copeland Jr.
AGENT

United States Patent Office 3,269,875
Patented August 30, 1966

3,269,875
THERMOELECTRIC ASSEMBLY WITH HEAT SINK
Arlton H. White, Dallas, Tex., assignor to Texas Instruments Incorporated, Dallas, Tex., a corporation of Delaware
Filed June 2, 1961, Ser. No. 114,565
5 Claims. (Cl. 136—212)

This invention relates generally to thermoelectric devices, and more particularly to improvements in a thermoelectric generator assembly.

One object of this ivention is to provide a thermoelectric generator assembly which has improved operating characteristics that are due to a unique and cooperating combination of structural elements and sub-assemblies.

Another object is to provide a thermoelectric generator assembly which includes an improved cooling arrangement in which a liquid-vapor cycle is employed for maximum utilization of the coolant employed.

A further object is to provide an improved liquid-vapor cooling arrangement for a thermoelectric device in which the movement of the coolant is entirely self-sustaining and requires no external application of power for motivation.

And another object is to provide a thermoelectric device in which the arrangement of parts is such that the essential electrical insulation between the cold junction of each thermoelectric junction and the adjacent structural member is made a more effective heat transmitter by the utilization of the technique of placing the electrical insulation in compression.

An additional object is to provide a more effective heat dissipating means for an array of thermoelectric elements by introducing yieldable loading to the electrical insulation employed in a heat transmitting capacity.

A still further object of this invention is to provide a heat sink for an array of thermoelectric elements which comprises the use of a flexible diaphragm of good heat conducting material in an overlying relation to the side of the thermoelectric elements from which heat must be removed.

And yet another object is to provide an improved heat sink for an array of individual thermoelectrical elements in which a metallic diaphragm having a "waffle" shaped pattern is employed to permit individual variations of substantial magnitude in spring loading and dimensional changes to take place relative to each individual thermoelectric element without damage to the diaphragm.

Other objects and advantages will be apparent from an examination of the following specification and drawing in which.

Figure 1:
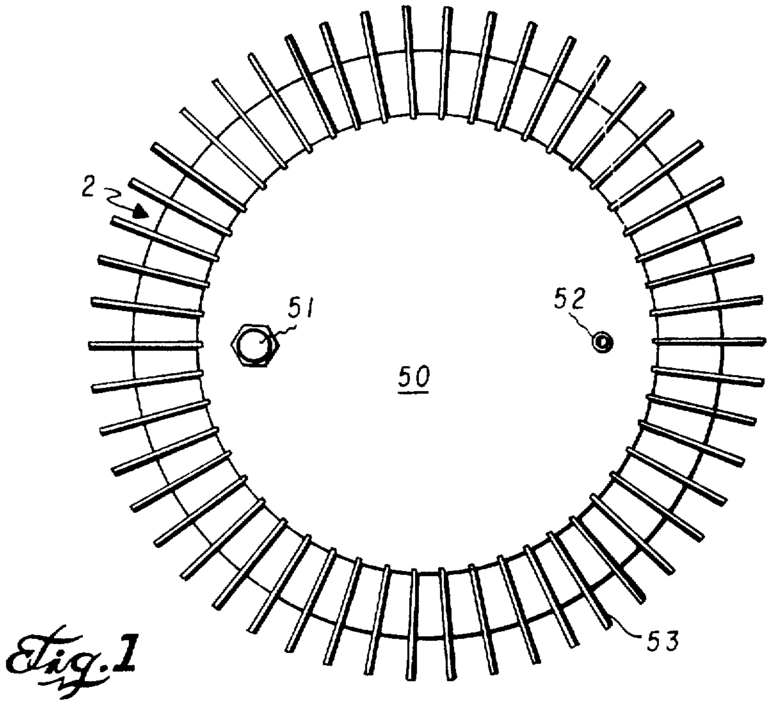
FIGURE 1 represents a top plan view of the thermoelectric generator assembly of this invention.
Figure 2:
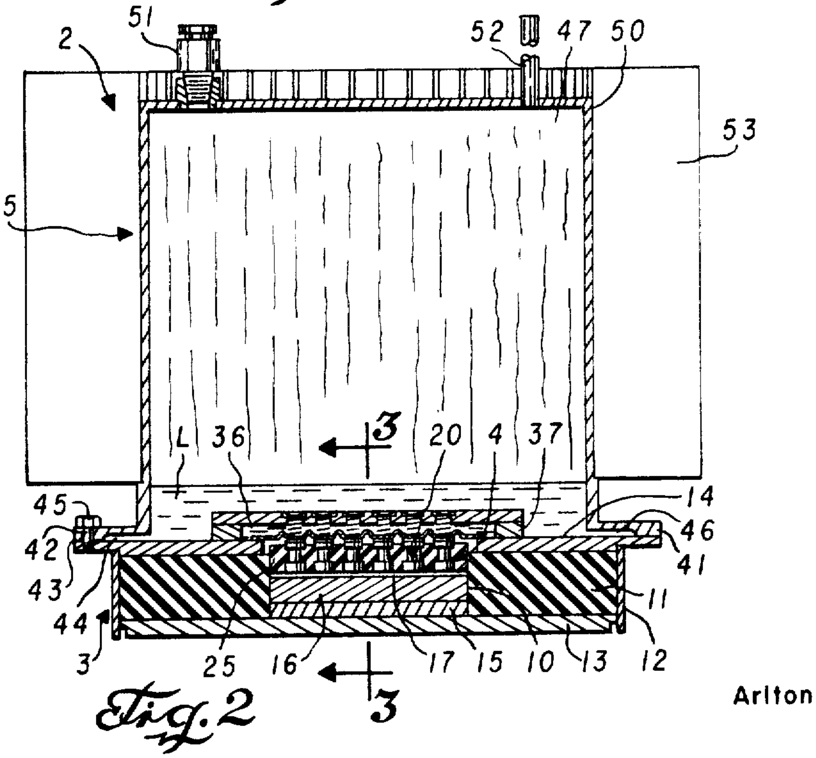
FIGURE 2 is a side elevational view of the device of this invention taken in section along the line 2—2 of FIGURE 1.

Referring now more particularly to the characters of reference on the drawing it will be observed in FIGURES 1 and 2 that the thermoelectric generator assembly of this invention identified generally at 2 consists basically of a support base assembly 3 including a thermoelectric generator identified at 4 and a relatively large hollow heat dissipating housing 5 attached to the support base 3 in surrounding relation to the thermoelectric generator 4.

Figures 3, 4:
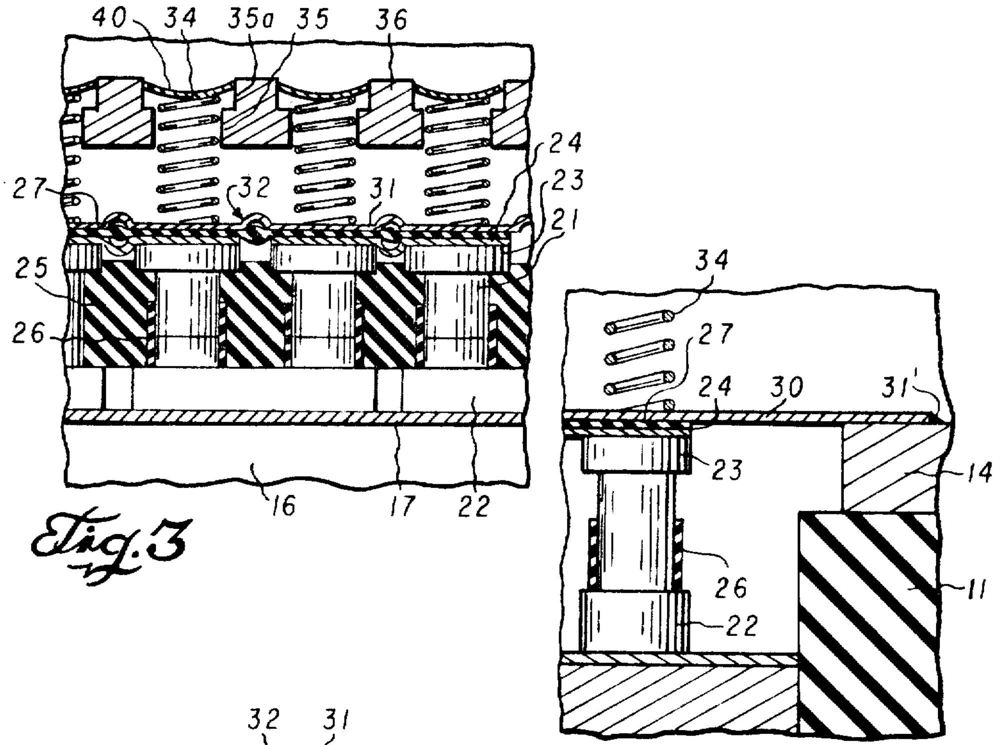
FIGURE 3 is an enlarged fragmentary sectional view of three thermoelectric elements and associated structures.
FIGURE 4 is a view similar to FIGURE 3 showing a modified embodiment of the diaphragm employed.
Figure 6:
FIGURE 6 is a cross-sectional elevational view of the diaphragm of FIGURE 5, taken along either the lines 6—6 or along the lines 6′—6′.
Figure 5:
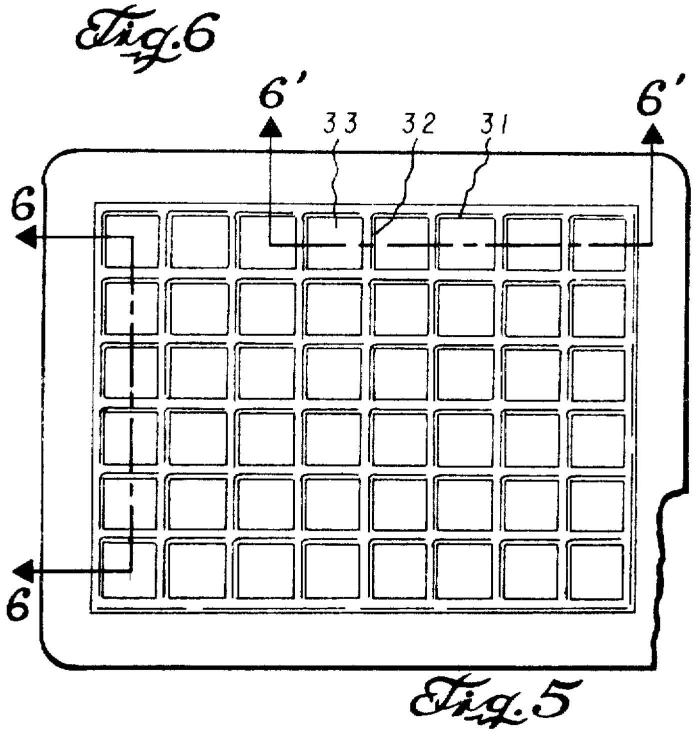
FIGURE 5 is a fragmentary top plan view of the waffle shaped diaphragm of this invention.

The thermoelectric generator 4 is supported within the base assembly 3 in a recess 10 in the large insulating block 11 which is contained within the generally cylindrical sidewall 12 and above the flat base plate 13 and below the top plate 14. Within the recess 10 there is also located a lower plate 15 made of copper or other good heat conducting material and attached to the bottom plate 13. Immediately above the copper plate 15 is a relatively large graphite plate 16 which is separated at its upper side from the thermoelectric generator 4 by means of a thin mica insulating sheet 17. The mica sheet in turn supports the hot side of each of a plurality of thermoelectric elements 20. Each of the thermoelectric elements 20 comprises a pair of legs 21 made of a thermoelectric material such as lead telluride, a lower hot shoe 22 made of iron, and an upper cold shoe 23 made of copper, all as shown in FIG. 3. A pair of the semiconductor thermocouple legs of opposite conductivity type connected in series will be referred to hereinafter as a thermocouple. When sufficient heat is supplied to the hot shoe elements and sufficient cooling is applied to the cold shoe elements to establish a heat gradient between these two shoes, a heat flow will exit and an electriral voltage will be established between the hot shoe and the cold shoe. Since one leg of the thermoelectric element is a p-type semiconductor and the other leg of the same element is an n-type semiconductor, this voltage will cause a current flow through the thermoelectric element when an external circuit is completed between the hot shoes. Useful electrical power may thus be obtained from this external circuit. Of course the amount of electrical power generated by a single thermoelectric element is usually too small to be of practical value and therefore a plurality of thermoelectric elements are usually arranged in series to form what is known as an array of thermoelectric elements and this array is referred to as a thermoelectric generator. In some cases the cold shoe 23 is directly and rigidly attached to each of a pair of legs 21; however, a better construction is seen in the use of an auxiliary electrical connector 24 which overlies each cold shoe 23 and provides electrical contact with each cold shoe and consequently with each leg 21 but without the incorporating of a rigid structural member which would be detrimental in the event of unequal expansion of the legs or other members of the thermoelectric element due to temperature increase or decrease. Both the hot shoe 22 and the cold shoe 23 are soldered or otherwise attached to their adjacent legs 21. The complete thermoelectric generator 20 is then superimposed on the thin mica layer 17 and the space between the legs 21 in the otherwise open area of recess 10 is then filled with an insulating material 25. Each leg 21 is also surrounded by a thin cylinder of rigid insulating material identified at 26. Another thin layer of insulating material 27 is laid over the entire array of thermoelectric elements 20 and a flexible metallic diaphragm 30 is positioned on the top side of the insulating layer 27, as shown in FIG. 4. This diaphragm is soldered or otherwise attached to the top plate 14 in the manner shown at 31′. This metallic diaphragm may be a relatively thin plate of copper which is flat and continuous as indicated at 30 or may be an improved version as indicated at 31 in FIGURE 3. The improved diaphragm 31 includes a plurality of ripples 32 which gives this diaphragm an overall "waffle" apeparance as seen in FIGURES 5 and 6. In these figures it will be noted that the diaphragm 31 is actually composed of a plurality of rectangular sections 33 which are separated by a plurality of parallel ripples which are intersected by a second plurality of parallel ripples running at right angles to the first set.

The big advantage of this construction is that when the diaphragm is welded to the permanent portion of the base assembly 3 as shown at 31' then substantial variations between the thermal expansion of adjacent thermoelectric elements 20 does not impose undue strains which would tend to rupture the thin diaphragm 31, or cause the individual elements to break.

When either diaphragm 30 or 31 is positioned over the insulating layer 27 and the array of thermoelectric elements 20, a series of individual compression springs are arranged to engage the top surface of the diaphragm and apply pressure in an axial direction of each of the thermoelectric legs 21. This is accomplished by positioning each of the springs 34 into a recess 35 in a plate 36 which plate is supported in a superimposed relation to top plate 14 by means of spacer blocks 37. The upper end of the recesses 35 is enlarged slightly to receive a locking washer 40 in a manner to seat the springs 34 in their intended positions. Lock washer 40 is depressed as it is forced into the counter bore section **35*a* and is then spring loaded by virtue of its engagement with spring 34, so that the sharp peripheral edge of the lock washers 40 will bite into the side walls of counter bore 35*a* and securely retain the springs 34** in their intended positions. This provides an inexpensive and yet easily assembled arrangement for installing the springs in this thermoelectric generator assembly.

The heat dissipating means 5 includes a peripheral flange 41 having a drilled bolt circle 42 which aligns with a threaded bolt circle 43 in the peripheral flange 44 of top plate 14. At assembly, a plurality of bolts 45 engage the threaded holes in the bolt circle 43 to bind the two flanges 41 and 44 in locking engagement over an insulating layer 46 which is sandwiched therebetween to provide a fluid type seal. The interior area identified at 47 of the housing 50 of the heat dissipating means 5 is partially filled prior to operation with a liquid identified at L having a relatively low temperature boiling point. This may be accomplished by removal of inlet plug 51. The level of the liquid L is higher than the top of the super-structure plate 36 and by virtue of the open area below plate 36 and between spacers 37, the liquid L is permitted to come into intimate contact with the metallic diaphragm 31. In operation, the thermoelectric generator of this invention will deliver an electric current through its output leads (not shown) due to the application of heat to the bottom plate 13 from any known source of heat having a sufficient temperature at this point. One example of a source of heat that would be suitable for this use is the burning of waste gas in an oil field location. The heat applied at bottom plate 13 is then sufficient to impart heat to the hot shoes 22 of the thermoelectric elements 20 by virtue of the heat conduction through the copper plate 15, the graphite block 16 and the mica layer 17, each of which transfer a substantial amount of heat in a short time and with a relatively even distribution to the various hot shoes 22. The temperature of the hot shoes during operation is on the order of 950° F., whereas the temperature of the cold shoes 23 and consequently the temperature of connectors 24, mica layer 27, and diaphragms 30 or 31, will be on the order of 220° F. This will be seen to be a sufficient temperature to cause a liquid L having a low boiling point, as for example, water, to be partially converted into vapor that will fill the large hollow interior 47 of the housing 50. This housing is provided with a vent 52 to prevent an excessive pressure buildup within the housing 50 which might tend to damage the assembly 2. As the vapors from the liquid L rise due to their heat they will strike the top and side walls of housing 50 which are maintained at a cooler temperature than the vapor droplets, which will cause the vapor to be condensed and travel by gravity down the sidewalls back to the liquid supply L. A plurality of radially extending fins 53 assist this liquid vapor cycle, which provides a greater amount of heat transfer due to the latent heat of vaporization of the liquid than could be accomplished by either a metallic or a liquid heat sink used individually against the metallic diaphragm 30 or 31. For operating at lower temperatures, a vacuum line (not shown) may be attached to vent 52 to reduce the internal pressure of housing 50, and consequently reduce the required boiling temperature of the liquid L.

Thus, it will be seen that the metallic diaphragm 30 or 31 provides both an hermetic seal to prevent the liquid from coming in contact with the electrical conducting elements of the thermoelectric generator, and also permits expansion of the various members such as legs 21 of the thermoelectric elements 20 to expand and contract during the increase or decrease of temperature to which these elements are subjected during operation.

It has further been found that the application of pressure onto the diaphragm 30 or 31 and onto the insulating layer 27 will provide an effectively increased heat conduction from the thermoelectric elements 20 into the diaphragm and subsequently into the liquid which is adjacent thereto. This area of compression by the individual springs 34 is conecentrated above the legs 21 such that the insulating material which is not adjacent the top side of the thermoelectric elements 20 is not compressed.

Figure 7:
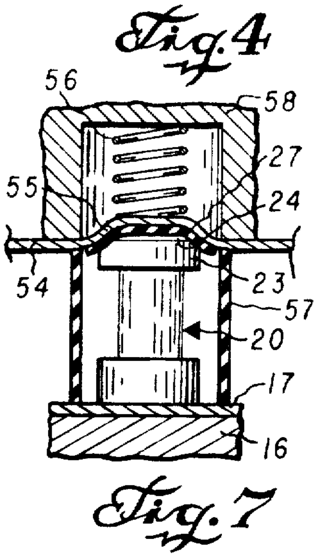
FIGURE 7 is a view similar to FIGURES 3 and 4 but showing a further embodiment of the diaphragm of this invention.

A modified embodiment of the diaphragm spring arrangement is seen in FIGURE 7. In this figure the thermoelectric element 20 is positioned over the lower insulating layer 17 resting on block 16 and the upper side of the thermoelectric element 20 has its cold shoe 23 in contact with electrical connector 24 which in turn is under a thin compressive insulating layer 27 which is adjacent a diaphragm 54 having a dimpled section 55 which is not only concavely curved to receive the thermoelectric elements 20 but is made of a spring material so that the dimpled section 55 applies a force against the resisting spring 56 when this spring and dimple are in the position shown in FIGURE 7. However, the spring constant of the spring 56 and the dimple 55 are chosen such that there is an even pressure exerted axially downward on the thermoelectric element 20 during all positions of the dimple 55 as the element 20 changes length during heat expansion and contraction. In order to operate properly the diaphragm 54 is supported both above and below by rigid support members. The lower support member is in the form of a rigid insulating tube 57 and the upper support is due to the configuration of the top super-structure 58 so that each supporting member applies support and pressure to the diaphragm on each side of the dimpled section 55. The dimple 55 has a snap action such that it resists compression in a downward direction until it approaches a horizontal position, but it is not stable in its horizontal position and if pressure is applied sufficient to force it a certain distance above its horizontal position it will then snap over and extend below its horizontal position with a similar resistant force thereafter to any pressure in an upward direction. The spring 57 on the other hand has a constant spring rate such that the combination of these two spring elements will tend to apply an even force on the thermoelectric element throughout the range of thermal expansion and contraction to which the element 20 will normally be subjected.

In conclusion, it will now be evident that the invention is disclosed in such clear and concise terms as will enable those skilled in the art to utilize and understand it. However, it will be equally evident that various modifications, substitutions and alterations may be made therein without departing from the spirit and scope of the appended claims.

What is claimed is:

1. An apparatus for generating electrical power comprising (a) means including an array of thermoelectric elements foming an electrical circuit for generating electrical power when a temperature differential is established across the lengths of said elements, (b) a first thermal conducting means in thermal contact with one side of said array, (c) a thin, flexible electrically insulating layer having one surface thereof abutting the other side of said array in good thermal contact therewith, (d) a thin, metallic diaphragm abutting the other surface of said insulating layer opposite said one surface, (e) said diaphragm being corrugated at regular intervals in each of two mutually perpendicular directions, and (f) means for compressing said insulating layer into good thermal contact with said other side of said array and said diaphragm.

2. An apparatus for generating electrical power comprising (a) means including an array of regularly spaced thermoelectric elements forming an electrical circuit for generating electrical power when a temperature differential is established across the lengths of said elements, (b) a first thermal conducting means in thermal contact with one side of said array, (c) a thin, flexible electrically insulating layer having one surface thereof abutting the other side of said array in good thermal contact therewith, (d) a thin, metallic diaphragm abutting the other surface of said insulating layer opposite said one surface, (e) said diaphragm being corrugated at regular intervals in each of two mutually perpendicular directions, (f) said corrugations being disposed in opposing relation with the spaces between said thermoelectric elements, and (g) means for compressing said insulating layer into good thermal contact with said other side of said array and said diaphragm.

3. An apparatus according to claim 2 wherein said means for compressing said insulating layer includes a separate compressed spring for each thermoelectric element exerting pressure on said diaphragm at a location between corrugations and opposing the end of said element.

4. An apparatus according to claim 2 wherein said first thermal conducting means includes a relatively thick layer of graphite adjacent to and in thermal contact with said one side of said array, said thermoelectric elements being comprised of the material lead-telluride.

5. An apparatus for generating electrical power comprising (a) means including an array of regularly spaced lead-telluride thermoelectric elements forming an electrical circuit for generating electrical power when a temperature differential is established across the lengths of said elements, (b) a first thermal conducting means in thermal contact with one side of said array and including a relatively thick layer of graphite adjacent to and in thermal contact with said one side, (c) a thin, flexible electrically insulating layer having one surface thereof abutting the other side of said array in good thermal contact therewith, (d) a thin, metallic diaphragm abutting the other surface of said insulating layer opposite said one surface, (e) said diaphragm being corrugated at regular intervals in each of two mutually perpendicular directions, (f) said corrugations being disposed in opposing relation with the spaces between said thermoelectric elements, and (g) a separate compressed spring for each thermoelectric element exerting pressure on said diaphragm at a location between corrugations and opposing the end of said element.

References Cited by the Examiner

UNITED STATES PATENTS

| | | | |
|---|---|---|---|
| 2,456,070 | 12/1948 | Malek et al. | 136—4.1 |
| 3,006,979 | 10/1961 | Rich | 136—4.2 |
| 3,082,275 | 3/1963 | Tabatt | 136—4 |
| 3,110,628 | 11/1963 | Ramey | 136—4 |
| 3,111,432 | 11/1963 | Sickert | 136—4 |
| 3,129,116 | 4/1964 | Corry | 136—4 |

FOREIGN PATENTS

| | | |
|---|---|---|
| 874,660 | 8/1961 | Great Britain. |

WINSTON A. DOUGLAS, *Primary Examiner.*

JOHN H. MACK, *Examiner.*

J. H. BARNEY, A. M. BEKELMAN, *Assistant Examiners.*